(12) United States Patent
Hsu et al.

(10) Patent No.: US 9,966,394 B2
(45) Date of Patent: May 8, 2018

(54) LIGHT SENSING DEVICE AND FABRICATING METHOD THEREOF

(71) Applicant: Industrial Technology Research Institute, Hsinchu (TW)

(72) Inventors: Feng-Chia Hsu, Kaohsiung (TW); Yu-Sheng Lin, Tainan (TW); Chun-Yin Tsai, Kaohsiung (TW); Sheng-Ren Chiu, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days. days.

(21) Appl. No.: 15/084,494

(22) Filed: Mar. 30, 2016

(65) Prior Publication Data
US 2017/0186786 A1 Jun. 29, 2017

(30) Foreign Application Priority Data

Dec. 25, 2015 (TW) .............................. 104143693 A

(51) Int. Cl.
*H01L 27/144* (2006.01)
*H01L 31/0216* (2014.01)
(Continued)

(52) U.S. Cl.
CPC .......... *H01L 27/1443* (2013.01); *G01J 5/023* (2013.01); *G01J 5/024* (2013.01);
(Continued)

(58) Field of Classification Search
CPC ........... H01L 27/1443; H01L 31/02164; H01L 31/024; H01L 31/02162; H01L 27/1463
See application file for complete search history.

(56) References Cited

U.S. PATENT DOCUMENTS 7,655,909 B2   2/2010  Schimert et al.
7,855,366 B2   12/2010 Park et al.
(Continued)

FOREIGN PATENT DOCUMENTS

CN    101476941    7/2009
CN    202204598    4/2012
(Continued)

OTHER PUBLICATIONS

Kang (Quora article "Why is polysilicon used as a gate contact instead of metal in CMOS?" archived at Wayback Machine on Jun. 11, 2015 and available online at https://web.archive.org/web/20150611011650/https://www.quora.com/Why-is-polysilicon-used-as-a-gate-contact-instead-of-metal-in-CMOS.*

(Continued)

*Primary Examiner* — Asok K Sarkar
*Assistant Examiner* — Grant Withers
(74) *Attorney, Agent, or Firm* — JCIPRNET

(57) ABSTRACT

A light sensing device includes a substrate, a semiconductor device layer, a metal and insulation material stacked structure, and a light absorption layer. The substrate has a recessed portion. The semiconductor device layer is located on the substrate. The metal and insulation material stacked structure is located on the semiconductor device layer and includes a first interconnect structure, a second interconnect structure surrounding the first interconnect structure, and a device conductive line. The light absorption layer is located on the metal and insulation material stacked structure. The first interconnect structure is located between the light absorption layer and the semiconductor device layer, such that the light absorption layer and the semiconductor device layer located at different levels can be connected to each other and exchange heat.

15 Claims, 10 Drawing Sheets

(51) Int. Cl.
| | |
|---|---|
| *H01L 31/024* | (2014.01) |
| *H01L 31/02* | (2006.01) |
| *H01L 31/0232* | (2014.01) |
| *H01L 31/18* | (2006.01) |
| *G01J 5/02* | (2006.01) |
| *G01J 5/10* | (2006.01) |
| *G01J 5/12* | (2006.01) |
| *G01J 5/20* | (2006.01) |

(52) U.S. Cl.
 CPC .  *G01J 5/10* (2013.01); *G01J 5/12* (2013.01); *G01J 5/20* (2013.01); *H01L 31/024* (2013.01); *H01L 31/02005* (2013.01); *H01L 31/02164* (2013.01); *H01L 31/02327* (2013.01); *H01L 31/18* (2013.01)

(56) References Cited

U.S. PATENT DOCUMENTS

| | | | |
|---|---|---|---|
| 2005/0072924 A1* | 4/2005 | Wood | G01J 5/20 250/338.1 |
| 2005/0224714 A1 | 10/2005 | Akin et al. | |
| 2006/0183265 A1* | 8/2006 | Oh | H01L 27/14687 438/65 |
| 2006/0267123 A1 | 11/2006 | Wu | |
| 2011/0248374 A1 | 10/2011 | Akin et al. | |
| 2012/0034729 A1 | 2/2012 | Tan et al. | |
| 2014/0054740 A1 | 2/2014 | Yama et al. | |
| 2015/0153236 A1 | 6/2015 | Yagami | |
| 2015/0333098 A1* | 11/2015 | Endo | H01L 31/0264 257/187 |

FOREIGN PATENT DOCUMENTS

| | | |
|---|---|---|
| CN | 101776483 | 6/2012 |
| CN | 101927976 | 9/2013 |
| CN | 102692276 | 5/2014 |
| CN | 102683474 | 11/2014 |
| EP | 1668707 | 6/2006 |
| EP | 2293034 | 3/2011 |
| EP | 1333503 | 7/2011 |
| EP | 2348294 | 7/2011 |
| EP | 2384425 | 11/2011 |
| JP | 2013011568 | 1/2013 |
| TW | 420826 | 2/2001 |
| TW | 488081 | 5/2002 |
| TW | 200905894 | 2/2009 |
| TW | I336394 | 1/2011 |
| TW | 201107724 | 3/2011 |
| TW | I387092 | 2/2013 |
| TW | 201418679 | 5/2014 |

OTHER PUBLICATIONS

Mathewson, A.G. "Optical absorption in aluminium and the effect of temperature" J. Phys. F Metal Phys., vol. 2. Mar. 1972 pp. 403-415.*

Schroder, Klaus "Optical Absorption of Copper and Copper-Rich Copper Nickel Alloys at Room Temperature" Phys. Rev. vol. 162, No. 3 Oct. 1967 pp. 628-631.*

Bauters, J. "Ultra-low-loss Single-mode Si3N4 Waveguides with 0.7 dB/m Propagation Loss" ECOC Technical Digest 2011 Sep. 2011 pp. 1-3.*

JK Consulting article on "High Reflectors" published May 2009 and retrieved and available online at https://web.archive.org/web/20090510090919/http ://www.kruschwitz.com:80/HR's.htm.*

"Office Action of Taiwan Counterpart Application", dated Feb. 20, 2017, p. 1-p. 4, in which the listed references were cited.

Gitelman et al., "CMOS-SOI-MEMS Transistor for Uncooled IR Imaging," IEEE Transactions on Electron Devices, Sep. 2009, pp. 1935-1942.

Lu et al., "CMOS micromachined structures using transistors in the subthreshold region for thermal sensing," Journal of Micromechanics and Microengineering, Jul. 2006, pp. 1734-1739.

Mottin et al., "Uncooled amorphous silicon technology enhancement for 25µm pixel pitch achievement," Proceedings of SPIE vol. 4820, Jan. 2003, pp. 200-207.

Shen et al., "An Uncooled Infrared Microbolometer Array for Low-Cost Applications," IEEE Photonics Technology Letters, Jun. 2015, pp. 1247-1249.

Tezcan et al., "A Low-Cost Uncooled Infrared Microbolometer Detector in Standard CMOS Technology," IEEE Transactions on Electron Devices, Feb. 2003, pp. 494-502.

Dong et al., "Fabrication and Characterization of Integrated Uncooled Infrared Sensor Arrays Using a-Si Thin-Film Transistors as Active Elements," Journal of Microelectromechanical Systems, Oct. 2005, pp. 1167-1177.

* cited by examiner

LIGHT SENSING DEVICE AND FABRICATING METHOD THEREOF

CROSS-REFERENCE TO RELATED APPLICATION

This application claims the priority benefit of Taiwan application serial no. 104143693, filed on Dec. 25, 2015. The entirety of the above-mentioned patent application is hereby incorporated by reference herein and made a part of this specification.

TECHNICAL FIELD

The disclosure relates to a light sensing device and a fabricating method thereof.

BACKGROUND

A method of fabricating a conventional uncooled infrared sensing unit requires dozens of manufacturing steps that are performed on an integrated circuit (IC) wafer and are not standard manufacturing steps required by the normal IC, thus posing challenges to obtain favorable yield and leading to difficulties in complying with the strict requirements for controlling additional manufacturing steps. Hence, based on the standard IC manufacturing process, the infrared sensing device and a reading circuit are integrated together, so as to improve the yield and ensure the benefit of economic of scale. Besides, the existing issues of the infrared sensing unit lie in the small effective light sensing region, the reduced efficiency of light absorption and conversion, and so forth. Hence, how to ensure the infrared sensing unit to achieve favorable light absorption and conversion efficiency and simplify the manufacturing process has become one of the important issues in terms of research and development.

SUMMARY

The disclosure provides a light sensing device that includes a substrate, a semiconductor device layer, a metal and insulation material stacked structure, and a light absorption layer. The substrate has a recessed portion. The semiconductor device layer is located on the substrate. The metal and insulation material stacked structure is located on the semiconductor device layer and includes a first interconnect structure, a second interconnect structure surrounding the first interconnect structure, and a device conductive line. The light absorption layer is located on the metal and insulation material stacked structure. The first interconnect structure is located between the light absorption layer and the semiconductor device layer, such that the light absorption layer and the semiconductor device layer located at different levels can be connected to each other and exchange heat.

The disclosure provides a light sensing device that includes a substrate, a semiconductor device layer, a metal and insulation material stacked structure, and a light absorption layer. The substrate has a recessed portion. The semiconductor device layer is located on the substrate. The metal and insulation material stacked structure is located on the semiconductor device layer and includes a first interconnect structure, a second interconnect structure surrounding the first interconnect structure, and a device conductive line. The second interconnect structure serves as an etch blocking structure, such that a gap is between the first interconnect structure and the second interconnect structure surrounding the first interconnect structure. The light absorption layer is formed on the metal and insulation material stacked structure. The first interconnect structure is located between the light absorption layer and the semiconductor device layer, such that the light absorption layer and the semiconductor device layer located at different levels can be connected to each other and exchange heat.

The disclosure provides a light sensing device that includes a substrate, a semiconductor device layer, a metal and insulation material stacked structure, and a light absorption layer. The substrate has a recessed portion. The semiconductor device layer is located on the substrate. The metal and insulation material stacked structure is located on the semiconductor device layer and includes a first interconnect structure, a dielectric layer surrounding the first interconnect structure, and a device conductive line. The dielectric layer encapsulating the device conductive line serves as an etch blocking structure, such that a gap is between the first interconnect structure and the dielectric layer surrounding the first interconnect structure and encapsulating the device conductive line. The light absorption layer is located on the first interconnect structure. The first interconnect structure is located between the light absorption layer and the semiconductor device layer, such that the light absorption layer and the semiconductor device layer located at different levels are connected to each other and exchange heat.

The disclosure provides a fabricating method of a light sensing device. The fabricating method includes providing a substrate, and the substrate has a recessed portion that is filled with an insulation material. The fabricating method further includes forming a semiconductor device layer on the substrate and forming a metal and insulation material stacked structure on the semiconductor device layer. The metal and insulation material stacked structure includes a dielectric layer, a first interconnect structure, a second interconnect structure, and a device conductive line. The fabricating method further includes forming a light absorption layer on the metal and insulation material stacked structure, and the light absorption layer is connected to the first interconnect structure and is separated from the second interconnect structure. A portion of the dielectric layer in the metal and insulation material stacked structure is removed, and the insulation material in the recessed portion of the substrate is simultaneously removed, so as to form a gap between the light absorption layer and the second interconnect structure, between the second interconnect structure and the first interconnect structure, and between the substrate and the semiconductor device layer, respectively.

The disclosure provides a fabricating method of a light sensing device, and the fabricating method includes providing a substrate, forming a semiconductor device layer on the substrate, and forming a metal and insulation material stacked structure on the semiconductor device layer. The metal and insulation material stacked structure includes a dielectric layer, a first interconnect structure, a second interconnect structure, and a device conductive line. The fabricating method further includes forming a light absorption layer on the metal and insulation material stacked structure, and the light absorption layer is connected to the first interconnect structure. A portion of the second interconnect structure in the metal and insulation material stacked structure is removed, and a portion of the substrate below the semiconductor device layer is also removed to form a recessed portion, so as to form a gap between the light absorption layer and the dielectric layer encapsulating the device conductive layer, between the dielectric layer encapsulating the device conductive layer and the first interconnect structure, and between the substrate and the semiconductor device layer, respectively.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
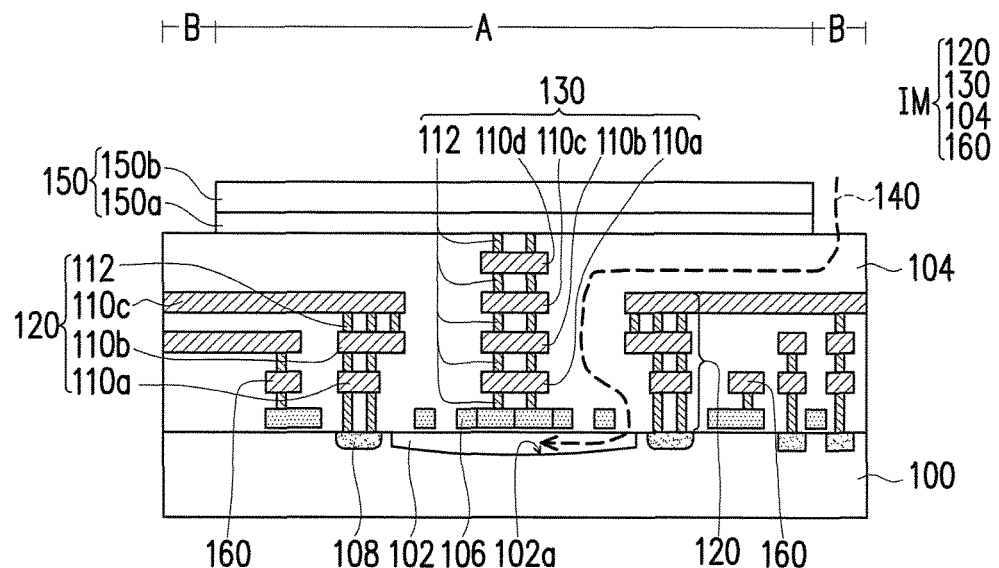
FIG. 1A and FIG. 1B are schematic cross-sectional views illustrating a fabricating method of a light sensing device according to an exemplary embodiment of the disclosure.
Figure 1B:
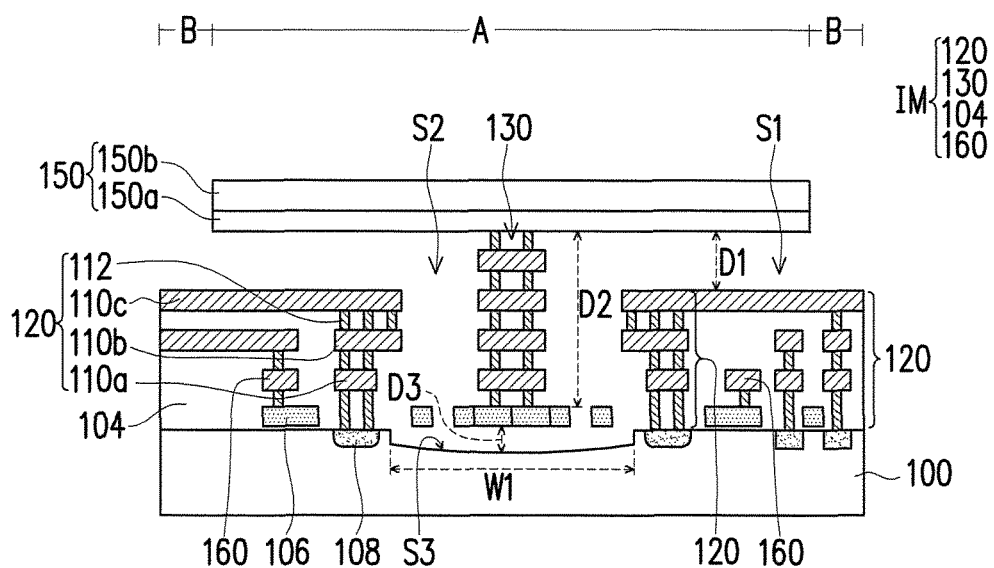

FIG. 1A and FIG. 1B are schematic cross-sectional views illustrating a fabricating method of a light sensing device according to an exemplary embodiment of the disclosure. With reference to FIG. 1A, the fabricating method of a light sensing device includes following steps. A substrate 100 that has a recessed portion 102a filled with an insulation material 102 is provided. The substrate 100 is, for instance, a silicon substrate or any other appropriate semiconductor substrates. A method of forming the recessed portion 102a in the substrate and forming the insulation material 102 in the recessed portion 102a includes forming the recessed portion 102a through performing a known photolithography and etching process, for instance. An insulation material is deposited on the substrate 100 to fill the recessed portion 102a, and a portion of the insulation material is removed by performing a chemical mechanical polishing process, and thereby the insulation material 102 in the recessed portion 102a is left. Note that the method of forming the recessed portion 102a and the insulation material 102 is not limited in the disclosure.

A semiconductor device layer 106 is formed on the substrate 100. The semiconductor device layer 106 is, for instance, a PN diode device, a semiconductor resistor device, a junction device, a thermopile device, and so forth, and the semiconductor device layer 106 is formed by performing an existing or known semiconductor IC manufacturing process. In an exemplary embodiment, the semiconductor device layer 106 is a polysilicon layer in a complementary metal oxide semiconductor (CMOS) device layer. The foresaid polysilicon layer serves as a series connected temperature sensitive diode can be doped by p-type or n-type dopants via a spatial periodicity for enhancing a temperature coefficient of voltage (TCV) of the polysilicon layer. Alternatively, the polysilicon layer may also serve as a temperature sensitive resistor, and a temperature coefficient of resistance (TCR) of the polysilicon layer can be raised by adjusting concentration of p-type dopants or n-type dopants.

A metal and insulation material stacked structure IM is formed on and connected to the semiconductor device layer 106. The metal and insulation material stacked structure IM includes a dielectric layer 104, a first interconnect structure 130, a second interconnect structure 120, and a device conductive line 160. The first interconnect structure 130 at least includes a dielectric material, a metal connection via, or a metal layer in the CMOS device layer. Specifically, the first interconnect structure 130 includes a plurality of connection structures 112 and a plurality of metal pattern layers 110a, 110b, 110c, and 110d arranged from bottom to top to form a multi-layer structure. Each of the connection structures 112 is located between two adjacent metal pattern layers of the metal pattern layers 110a, 110b, 110c, and 110d, such that every two adjacent metal pattern layers are connected. The first interconnect structure 130 and the underlying semiconductor device layer 106 can exchange heat. Similarly, the second interconnect structure 120 includes a plurality of connection structures 112 and a plurality of metal pattern layers 110a, 110b, and 110c arranged from bottom to top to form a multi-layer structure. Each of the connection structures 112 is located between two adjacent metal pattern layers of the metal pattern layers 110a, 110b, and 110c, such that every two adjacent metal pattern layers are connected. The metal pattern layers 110a, 110b, 110c, and 110d and the connection structures 112 are located in the dielectric layer 104 that is made of silicon oxide or any other appropriate insulation material. The connection structures 112 are metal connection vias in the CMOS device layer and are made of tungsten, for instance.

Note that the first interconnect structure 130 provided in the present exemplary embodiment is located at the center of the device, and the second interconnect structure 120 surrounds the first interconnect structure 130. A height of the first interconnect structure 130 is greater than a height of the second interconnect structure 120, and the number of metal pattern layers in the first interconnect structure 130 is more than the number of metal pattern layers in the second interconnect structure 120.

A light absorption layer 150 is then formed on the metal and insulation material stacked structure IM, and the light absorption layer 150 is connected to the first interconnect structure 130 and is separated from the second interconnect structure 120. According to the present exemplary embodiment, the light absorption layer 150 at least includes a metal layer 150a and a material 150b characterized by electromagnetic propagation loss, and the metal layer 150a is connected to the first interconnect structure 130 and separated from the second interconnect structure 120 by the dielectric layer 104. The material 150b characterized by electromagnetic propagation loss is stacked onto the metal layer 150a. In the present exemplary embodiment, the metal layer 150a is made of Al or another metal material, for instance, and the material 150b characterized by electromagnetic propagation loss is silicon nitride or a material having an etching selectivity with respect to the dielectric layer 104, for instance.

A portion of the dielectric layer 104 in the metal and insulation material stacked structure IM is removed, and the insulation material 102 in the recessed portion 102a of the substrate 100 is simultaneously removed. According to the present exemplary embodiment, the removing process may be an etching process, e.g., a wet etching process. An etchant is applied to remove a portion of the dielectric layer 104 and the insulation material 102 through an etching path 140. After the etching process is completely performed, the resultant structure is shown in FIG. 1B, i.e., a gap S1 is formed between the light absorption layer 150 and the second interconnect structure 120, a gap S2 is formed between the second interconnect structure 120 and the first interconnect structure 130, and a gap S3 is formed between the substrate 100 and the semiconductor device layer 106, respectively. The gap S3 is the recessed portion 102a of the substrate 100.

Note that the second interconnect structure 120 may serve as an etch blocking structure during the aforesaid etching process, such that the gap S2 is formed between the first interconnect structure 130 and the second interconnect structure 120. To be specific, while the dielectric layer 104 is being etched, liquid or gas etchant has an etching selectivity with respect to the dielectric layer 104 and the metal material; therefore, the light absorption layer 150 is not etched, and the etching process is stopped at the regions where the metal pattern layers 110a, 110b, 110c, and 110d and the connection structures 112 are located. Thereby, the gaps S1 and S2 are formed. Similarly, the liquid or gas etchant has an etching selectivity with respect to the insulation material 102 and the polysilicon layer; therefore, the insulation material 102 is removed by performing the etching process, so as to form the gap S3 between the semiconductor device layer and the substrate 100.

In the present exemplary embodiment, a distance D1 between the light absorption layer 150 and the second interconnect structure 120 is 2.5 μm, for instance, a distance D2 between the light absorption layer 150 and the semiconductor device layer 106 is 6.8 μm, for instance, and a distance D3 between the substrate 100 and the semiconductor device layer 106 is 0.35 μm, for instance. Besides, a width W1 of the recessed portion 102a of the substrate (i.e., the width of the gap S3) is 10 μm, for instance.

Figure 2:
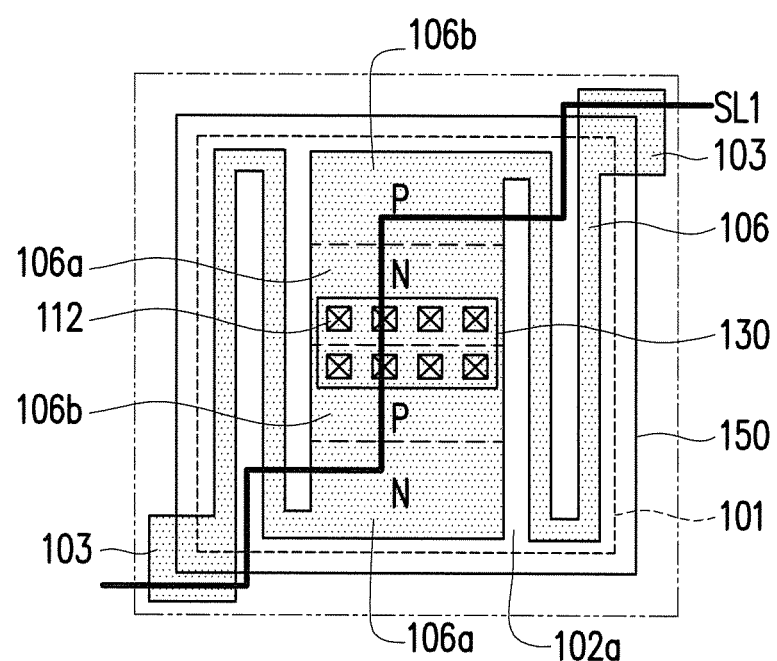
FIG. 2 is a schematic top view illustrating a light sensing device according to an exemplary embodiment of the disclosure.

FIG. 2 is a schematic top view illustrating the sensing device layer depicted in FIG. 1B, and a cross-sectional line SL1 shown in FIG. 2 reveals the structure of FIG. 1B. As shown in FIG. 2, the semiconductor device layer 106 includes an n-type region 106a and a p-type region 106b. The semiconductor device layer 106 and the light absorption layer 150 are connected to each other through the first interconnect structure 130. The recessed portion 102a is located below the light sensing device, and the recessed portion 102a is, for instance, a shallow trench isolation region. In addition, the light sensing device is fixed onto the substrate 110 by using a recessed portion boundary 101 and structure fixed ends 103.

As provided above, in the light sensing device described in the present exemplary embodiment, the semiconductor device layer 106 and the light absorption layer 150 are connected to each other through the first interconnect structure 130, such that the light absorption layer 150 and the semiconductor device layer 106 located at different levels are connected to each other. That is, when the light absorption layer 150 absorbs light (e.g., an infrared beam), the heat generated by the infrared beam in the light absorption layer 150 is transmitted to the semiconductor device layer 106 through the first interconnect structure 130, such that the temperature of the semiconductor device layer 106 is changed. Due to the temperature change, the semiconductor device layer 106 can produced a corresponding change in the electrical properties (e.g., a change in a current-voltage characteristic curve), and the semiconductor device layer 106 is electrically connected to the read-out circuit through the device conductive line 160, such that a corresponding sensing signal is generated by the read-out circuit. Particularly, the light absorption layer 150 and the semiconductor device layer 106 provided in the present exemplary embodiment are located at different horizontal levels, and therefore the area occupied by the light absorption layer 150 is not restricted by the area occupied by the semiconductor device layer 106. That is, the area occupied by the light absorption layer 150 (i.e., the area of the light sensing region A) can be as large as possible, so as to enhance the performance of the light sensing device. In an exemplary embodiment, if the area occupied by the semiconductor device layer 106 is sufficiently large, the area occupied by the light absorption layer 150 and the area occupied by the first interconnect structure 130 may be equal to the planar area occupied by the semiconductor device layer 106 above the recessed portion; namely, the light absorption layer 150 as well as the first interconnect structure 130 and the planar portion of the semiconductor device layer 106 above the recessed portion are identically shaped and stacked together. Besides, the gaps S1, S2, and S3 formed in the light sensing device are filled with air, which leads to the reduction of heat exchange. Thereby, heat can be prevented from being dissipated, and the temperature sensing sensitivity of the semiconductor device layer 106 can be enhanced.

In the previous embodiment, the light absorption layer 150 is formed by stacking the metal layer 150a and the material 150b characterized by electromagnetic propagation loss. In this stacked structure, the metal layer 150a serves as a light reflection layer, and the material 150b characterized by electromagnetic propagation loss serves as an infrared absorption layer. If an external infrared beam enters the light absorption layer 150, the infrared beam is not only absorbed by the material 150b characterized by electromagnetic propagation loss but also reflected by the metal layer 150a to the material 150b, such that the infrared beam can be absorbed again. Thereby, the infrared absorption and conversion efficiency can be enhanced.

Figure 3A:
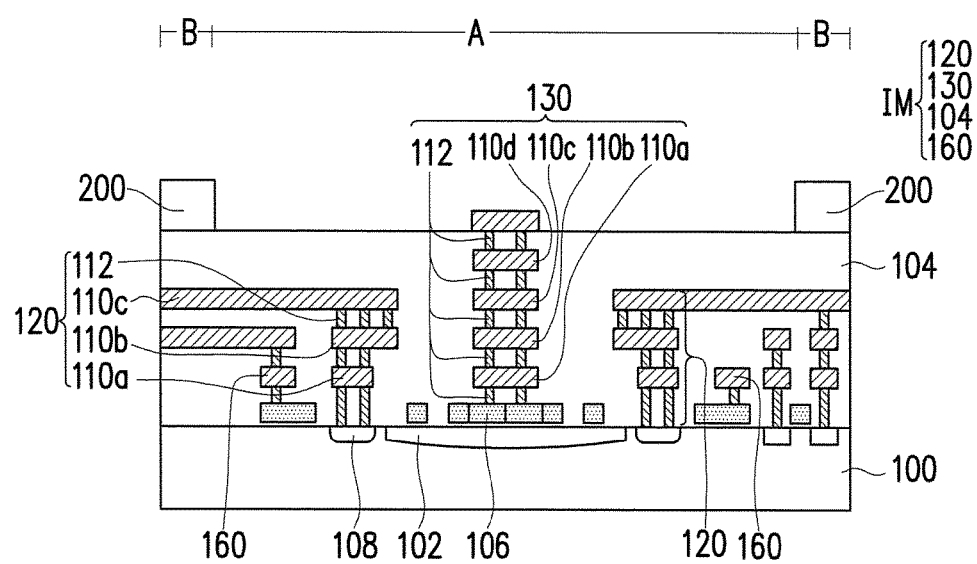
FIG. 3A to FIG. 3C are schematic cross-sectional views illustrating a fabricating method of a light sensing device according to an exemplary embodiment of the disclosure.
Figure 3B:
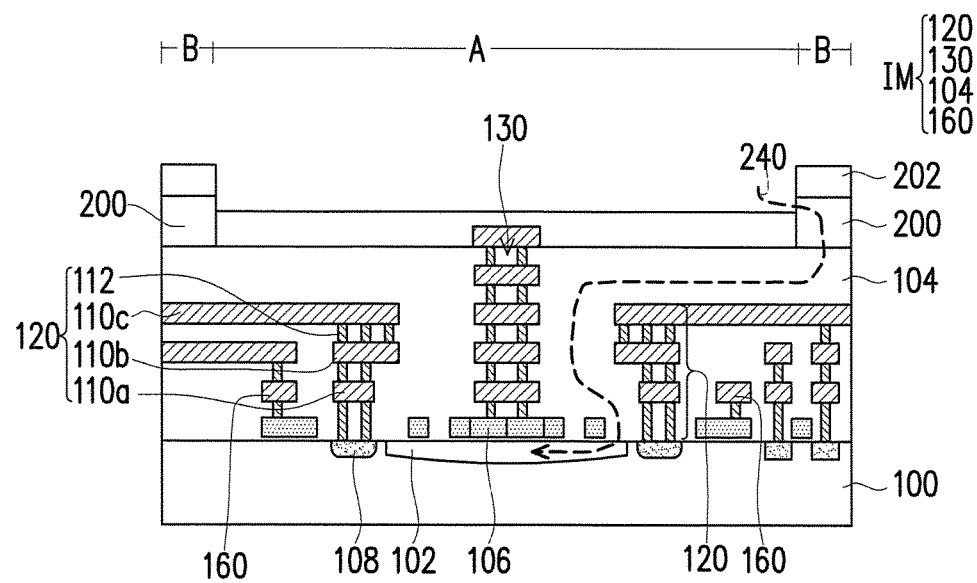
Figure 3C:
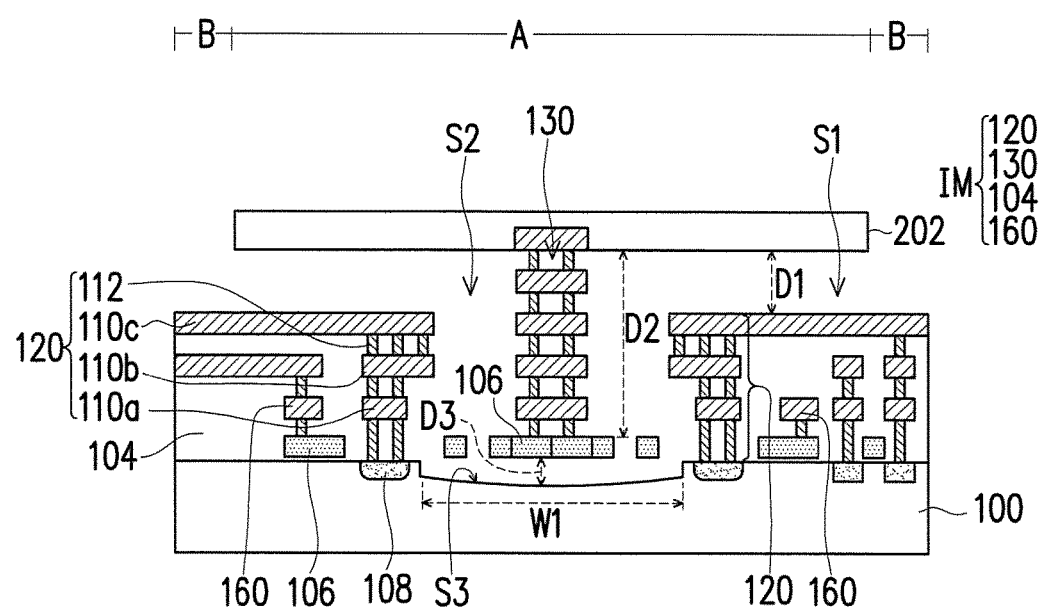

FIG. 3A to FIG. 3C are schematic cross-sectional views illustrating a fabricating method of a light sensing device according to an exemplary embodiment of the disclosure. The embodiment depicted in FIG. 3A to FIG. 3C is similar to that depicted in FIG. 1A and FIG. 1B; therefore, the same devices in these embodiments are represented by the same reference numbers and will not be further explained. With reference to FIG. 3A, the semiconductor device layer 106 and the metal and insulation material stacked structure IM (including the dielectric layer 104, the first interconnect structure 130, the second interconnect structure 120, and the device conductive line 160) are formed on the substrate 100, and a sacrificial layer 200 is formed on the dielectric layer 104. The sacrificial layer 200 does not cover the light sensing region A and is correspondingly formed in a peripheral region B. The sacrificial layer 200 is made of the same material of the dielectric layer 104 or made of a material having an etching selectivity with respect to a light absorption layer 202, e.g., photoresist.

With reference to FIG. 3B, the light absorption layer 202 is formed on the metal and insulation material stacked structure IM and the sacrificial layer 200, and the light absorption layer 202 located on the sacrificial layer 200 is not connected to the light absorption layer 202 located on the dielectric layer 104 of the metal and insulation material stacked structure IM due to the arrangement of the sacrificial layer 200, such that a portion of the sacrificial layer 200 is exposed. According to the present exemplary embodiment, the light absorption layer 202 has a sandwich-like stacked structure composed of silicon/metal/silicon, and the metal in the stacked structure includes titanium nitride (TiN), nickel chromium (NiCr), aurum (Au), titanium (Ti), or any other material characterized by electromagnetic propagation loss. An etching process is then performed. In the etching process, the exposed sacrificial layer 200 serves as the origin of an etching path 240, and a portion of the dielectric layer 104 and the insulation material 102 are removed through the etching path 240; at the same time, the light absorption layer 202 located on the sacrificial layer 200 is lifted off, and the light absorption layer 202 located in the light sensing region A is left. After the etching process is completely performed, the resultant structure is shown in FIG. 3C, i.e., a gap S1 is formed between the light absorption layer 202 and the second interconnect structure 120, a gap S2 is formed between the second interconnect structure 120 and the first interconnect structure 130, and a gap S3 is formed between the substrate 100 and the semiconductor device layer 106, respectively. The gap S3 is the recessed portion 102a of the substrate 100.

Similarly, during the aforesaid etching process, the second interconnect structure 120 may serve as an etch blocking structure, such that the gap S2 is formed between the first interconnect structure 130 and the second interconnect structure 120. To be specific, while the dielectric layer 104 is being etched, etching liquid or gas has an etching selectivity with respect to the dielectric layer 104 and the metal material; therefore, the light absorption layer 202 is not etched, and the etching process is stopped at the regions where the metal pattern layers 110a, 110b, 110c, and 110d and the connection structures 112 are located. Thereby, the gaps S1 and S2 are formed. Similarly, the liquid or gas etchant has an etching selectivity with respect to the insulation material 102 and the polysilicon layer; therefore, the insulation material 102 is removed through performing the etching process, so as to form the gap S3 between the semiconductor device layer 106 and the substrate 100.

Figure 4A:
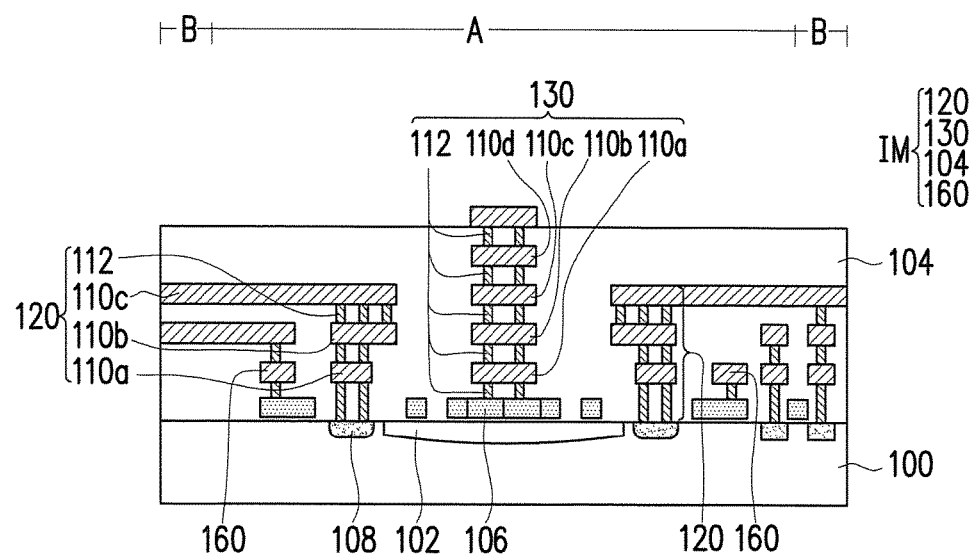
FIG. 4A to FIG. 4C are schematic cross-sectional views illustrating a fabricating method of a light sensing device according to an exemplary embodiment of the disclosure.
Figure 4B:
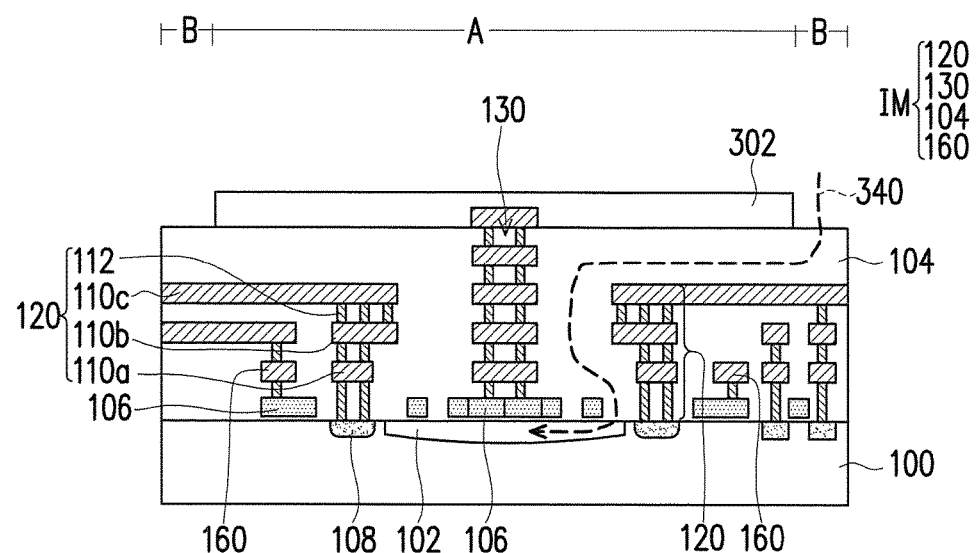
Figure 4C:
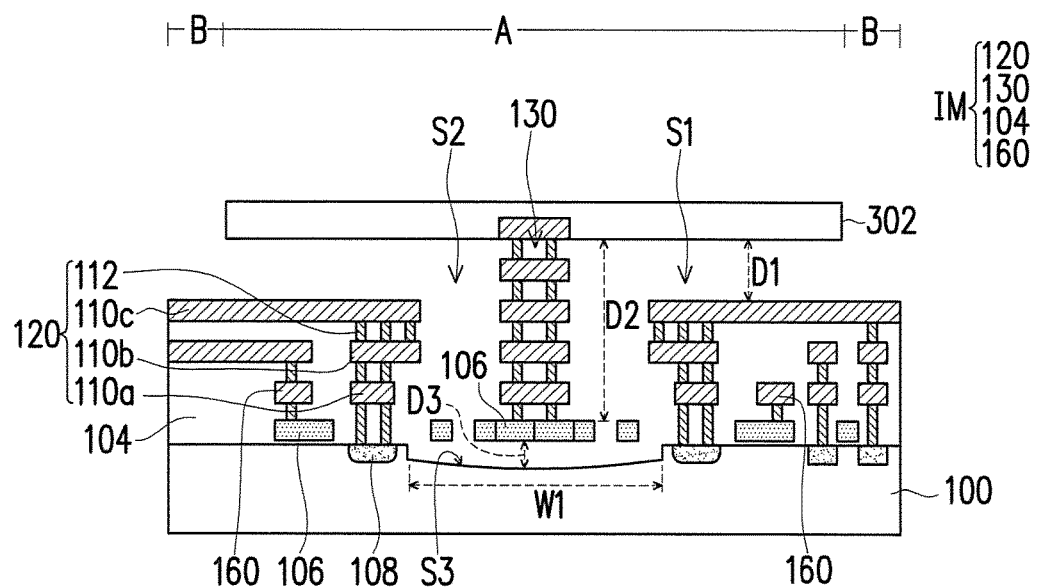

FIG. 4A to FIG. 4C are schematic cross-sectional views illustrating a fabricating method of a light sensing device according to an exemplary embodiment of the disclosure. The embodiment depicted in FIG. 4A to FIG. 4C is similar to that depicted in FIG. 1A and FIG. 1B; therefore, the same devices in these embodiments are represented by the same reference numbers and will not be further explained. With reference to FIG. 4A, the semiconductor device layer 106 and the metal and insulation material stacked structure IM (including the dielectric layer 104, the first interconnect structure 130, the second interconnect structure 120, and the device conductive line 160) are formed on the substrate 100, and a light absorption layer 302 is formed on the metal and insulation material stacked structure IM, as shown in FIG. 4B. The light absorption layer 302 exposes the dielectric layer 104 on the second interconnect structure 120. According to the present exemplary embodiment, the light absorption layer 302 has a sandwich-like stacked structure composed of silicon/metal/silicon, and the metal in the stacked structure includes TiN, NiCr, Au, Ti, or any other material characterized by electromagnetic propagation loss.

An etching process is then performed. In the etching process, the exposed dielectric layer 104 serves as the origin of an etching path 340, and a portion of the dielectric layer 104 and the insulation material 102 are removed through the etching path 340. After the etching process is completely performed, the resultant structure is shown in FIG. 4C, i.e., a gap S1 is formed between the light absorption layer 302 and the second interconnect structure 120, a gap S2 is formed between the second interconnect structure 120 and the first interconnect structure 130, and a gap S3 is formed between the substrate 100 and the semiconductor device layer 106, respectively. The gap S3 is the recessed portion 102a of the substrate 100.

Similarly, during the aforesaid etching process, the second interconnect structure 120 may serve as an etch blocking structure, such that the gap S2 is formed between the first interconnect structure 130 and the second interconnect structure 120. To be specific, while the dielectric layer 104 is being etched, etching liquid or gas has an etching selectivity with respect to the dielectric layer 104, the metal material, and the light absorption layer 302; therefore, the light absorption layer 302 is not etched, and the etching process is stopped at the regions where the metal pattern layers 110a, 110b, 110c, and 110d and the connection structures 112 are located. Thereby, the gaps S1 and S2 are formed. Similarly, the liquid or gas etchant has an etching selectivity with respect to the insulation material 102 and the polysilicon layer; therefore, the insulation material 102 is removed through performing the etching process, so as to form the gap S3 between the semiconductor device layer 106 and the substrate 100.

Figure 5A:
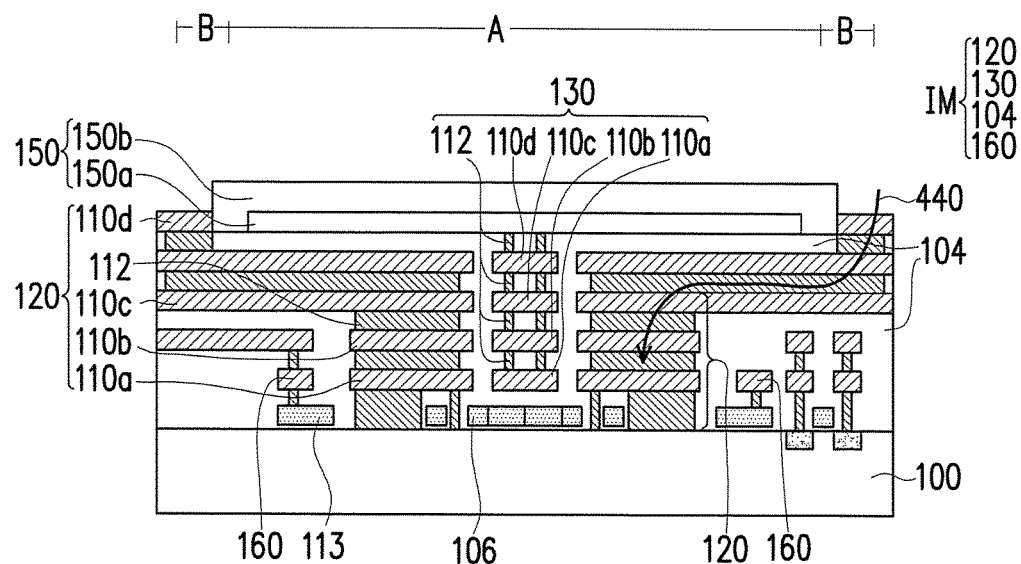
FIG. 5A to FIG. 5C are schematic cross-sectional views illustrating a fabricating method of a light sensing device according to an exemplary embodiment of the disclosure.
Figure 5B:
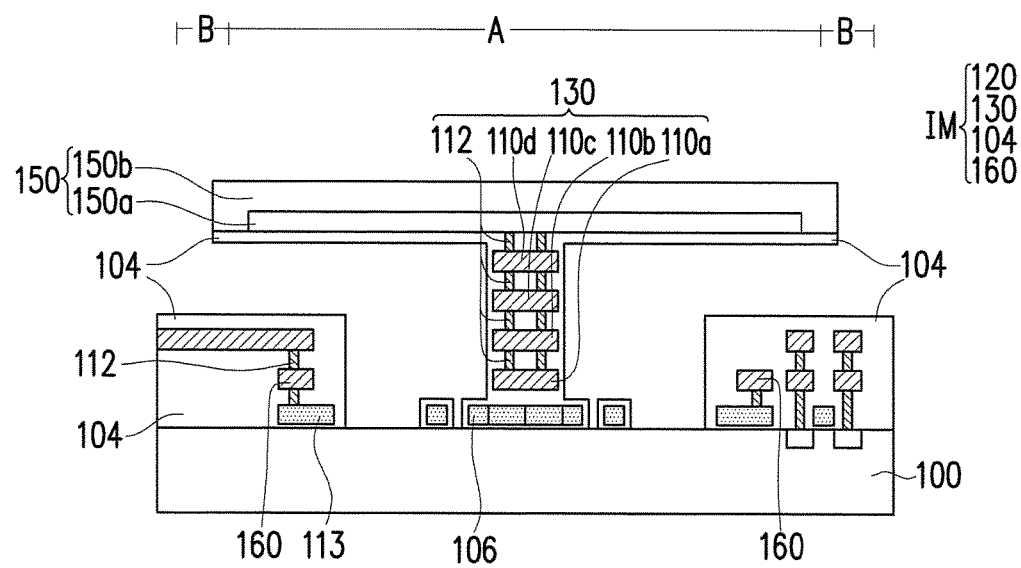
Figure 5C:
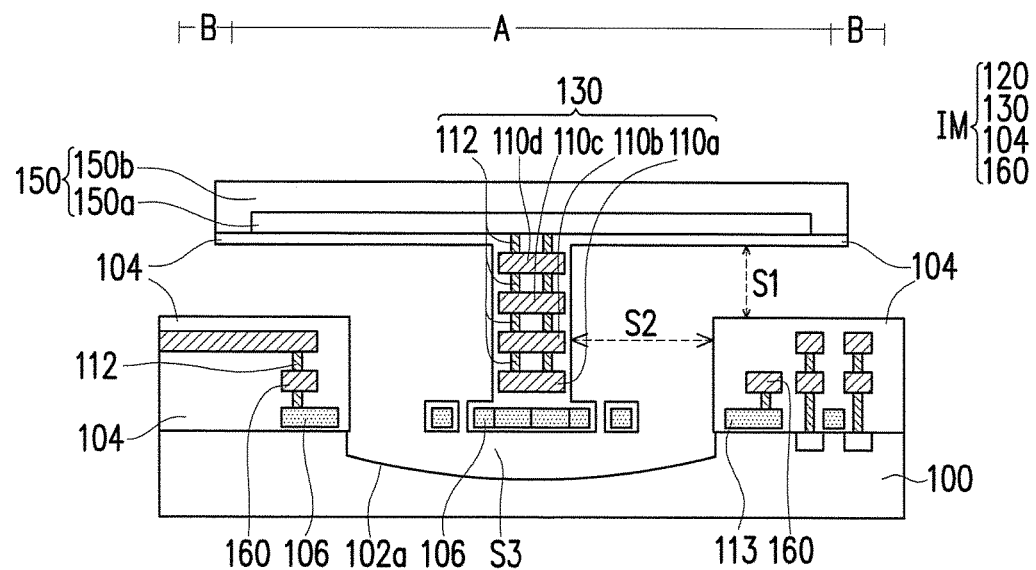

FIG. 5A to FIG. 5C are schematic cross-sectional views illustrating a fabricating method of a light sensing device according to an exemplary embodiment of the disclosure. The embodiment depicted in FIG. 5A to FIG. 5C is similar to that depicted in FIG. 1A and FIG. 1B; therefore, the same devices in these embodiments are represented by the same reference numbers and will not be further explained. With reference to FIG. 5A, the semiconductor device layer 106 and the metal and insulation material stacked structure IM (including a dielectric layer 104, a first interconnect structure 130, a second interconnect structure 120, and a device conductive line 160) are formed on the substrate 100. The light absorption layer 150 is formed on the metal and insulation material stacked structure IM, and the light absorption layer 150 exposes the second interconnect structure 120. According to the present exemplary embodiment, the light absorption layer 150 includes a metal layer 150a and a material 150b characterized by electromagnetic propagation loss. According to another exemplary embodiment, the light absorption layer may also have a sandwich-like stacked structure composed of silicon/metal/silicon, and the metal in the stacked structure includes TiN, NiCr, Au, Ti, or any other material characterized by electromagnetic propagation loss.

As shown in FIGS. 5A and 5B, an etching process is performed. In the etching process, the exposed second interconnect structure 120 serves as the origin of an etching path 440, and the second interconnect structure 120 are removed through the etching path 440. Particularly, in the present exemplary embodiment, the etching liquid or gas applied in the etching process has the etching selectivity with respect to the second interconnect structure 120 and the dielectric layer 104; hence, the second interconnect structure 120 is removed in the etching process, and the dielectric layer 104 is left. In an exemplary embodiment, the first interconnect structure 130 can be exclusively made of a dielectric material and is connected to the semiconductor device layer 106 through the dielectric material; alternatively, the first interconnect structure 130 can be made of the dielectric material that encapsulates all or parts of the metal pattern layers 110a, 110b, 110c, and 110d and the connection structures 112, so as to connect the semiconductor device layer 106 through the dielectric material or the dielectric material and the connection structures 112.

Another etching process is performed to remove a portion of the substrate 100 located below the semiconductor device layer 106 and form a recessed portion 102a, as shown in FIG. 5C. That is, in the resultant structure formed after the etching process is completely performed, a gap S1 is formed between the light absorption layer 150 and the dielectric layer 104 encapsulating the device conductive line 160, a gap S2 is formed between the dielectric layer 104 encapsulating the device conductive line 160 and the first interconnect structure 130, and a gap S3 is formed between the substrate 100 and the semiconductor device layer 106, respectively. The gap S3 is the recessed portion 102a of the substrate 100.

Similarly, during the aforesaid etching process, the dielectric layer 104 surrounding the second interconnect structure 120 may serve as an etch blocking structure, such that the gap S2 is formed between the dielectric layer 104 encapsulating the device conductive line 160 and the first interconnect structure 130. To be specific, while the second interconnect structure 120 is being etched, etching liquid or gas has an etching selectivity with respect to metal and the dielectric layer 104; therefore, the light absorption layer 150 is not etched, and the etching process is stopped at the region where the dielectric layer 104 is located. Thereby, the gaps S1 and S2 are formed. Similarly, liquid or gas etchant has an etching selectivity with respect to the dielectric layer 104 and the substrate 100; therefore, a portion of the substrate 100 is removed through performing the etching process, so as to form the gap S3 between the semiconductor device layer 106 and the substrate 100. Besides, the etching process is stopped at the region where the dielectric layer 104 is located.

Figure 7:
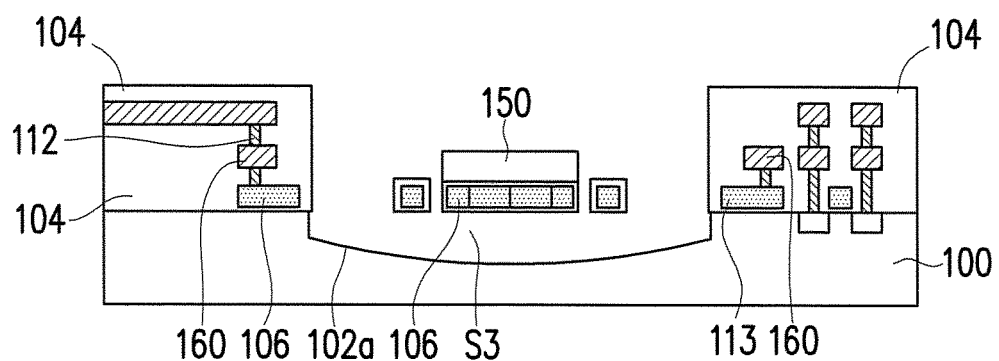
FIG. 7 is a schematic cross-sectional view illustrating a light sensing device according to an exemplary embodiment of the disclosure.

Similarly, in the embodiment of FIG. 5C, through changes in the mask design, the method of forming a heat isolation structures by etching the second interconnect structure 120 and removing the portion of the substrate 100 can be employed to produce a light sensing device without the first interconnect structure. That is, a light absorption material can be directly manufactured onto the semiconductor device layer 106, as shown in FIG. 7.

Figure 6:
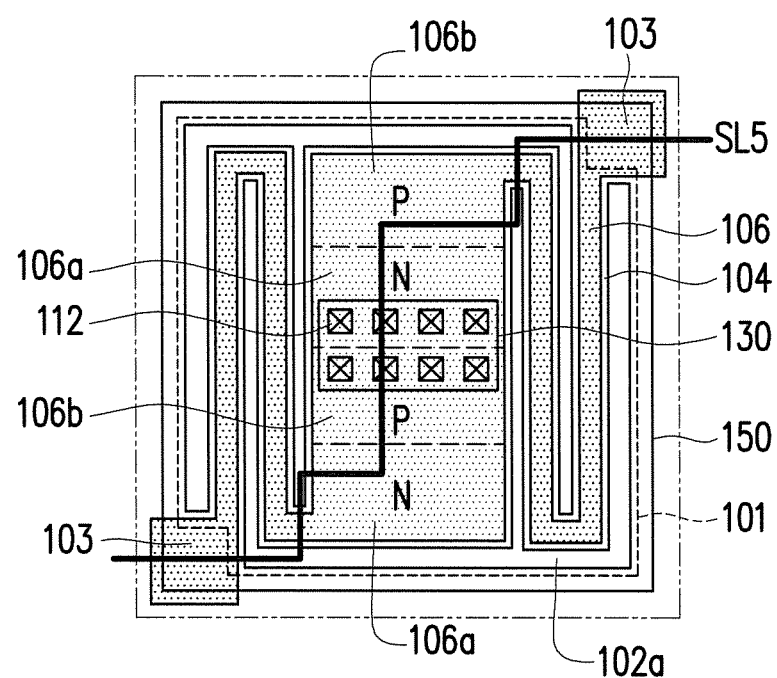
FIG. 6 is a schematic top view illustrating the light sensing device depicted in FIG. 5C, and a cross-sectional line SL5 shown in FIG. 6 reveals the structure of FIG. 5C.

FIG. 6 is a schematic top view illustrating the light sensing device depicted in FIG. 5C, and a cross-sectional line SL5 shown in FIG. 6 reveals the structure of FIG. 5C. As shown in FIG. 6, the semiconductor device layer 106 includes an n-type region 106a and a p-type region 106b. The semiconductor device layer 106 and the light absorption layer 150 are connected to each other through the first interconnect structure 130. A recessed portion 102a is located below the light sensing device, and the recessed portion 102a is, for instance, a shallow trench isolation region. In addition, the light sensing device is fixed onto the substrate 110 by using a recessed portion boundary 101 and structure fixed ends 103.

To sum up, the light absorption layer and the semiconductor device layer are connected to each other through the first interconnect structure in the metal and insulation material stacked structure, and the light absorption layer covers the semiconductor device layer, so as to increase the absorption area of the light absorption layer. Additionally, in the disclosure, the dielectric layer is etched, and the second interconnect structure of the metal and insulation material stacked structure serves as the etch blocking layer; alternatively, the second interconnect structure (made of metal) and a portion of the silicon substrate are etched, and the dielectric layer may serve as the etch blocking layer, so as to form specific gaps as heat isolation structures. Said method can also be applied for fabricating a new type of infrared sensing device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light sensing device comprising:
   a substrate having a recessed portion;
   a semiconductor device layer located directly above the recessed portion of the substrate, such that an airgap is between the semiconductor device layer and the substrate;
   a metal and insulation material stacked structure located on the semiconductor device layer, the metal and insulation material stacked structure comprising a first interconnect structure and a device conductive line;
   a light absorption layer, wherein the first interconnect structure is located between the light absorption layer and the semiconductor device layer, such that the light absorption layer and the semiconductor device layer located at different levels are connected to each other and exchange heat.

2. The light sensing device as recited in claim 1, wherein the first interconnect structure comprises:
   a plurality of metal pattern layers arranged from bottom to top to form a multi-layer structure; and
   a plurality of connection structures, each of the connection structures being located between two adjacent metal pattern layers of the metal pattern layers.

3. The light sensing device as recited in claim 1, wherein the semiconductor device layer is a polysilicon layer in a complementary metal oxide semiconductor device layer.

4. The light sensing device as recited in claim 1, wherein the first interconnect structure at least includes a dielectric material, a metal connection via, or a metal layer in a complementary metal oxide semiconductor device layer.

5. The light sensing device as recited in claim 1, wherein the light absorption layer at least includes a material layer characterized by electromagnetic propagation loss or includes a metal reflection layer and a material layer characterized by electromagnetic propagation loss.

6. A light sensing device comprising:
   a substrate having a recessed portion;
   a semiconductor device layer located directly above the recessed portion of the substrate, such that an airgap is between the semiconductor device layer and the substrate;
   a metal and insulation material stacked structure located on the semiconductor device layer, the metal and insulation material stacked structure comprising a first interconnect structure, a second interconnect structure surrounding the first interconnect structure, and a device conductive line, wherein the second interconnect structure serves as an etch blocking structure, such that a gap is between the first interconnect structure and the second interconnect structure surrounding the first interconnect structure;
   a light absorption layer located on the metal and insulation material stacked structure, wherein the first interconnect structure is located between the light absorption layer and the semiconductor device layer, such that the light absorption layer and the semiconductor device layer located at different levels are connected to each other and exchange heat, and a gap is between the second interconnect structure and the light absorption layer.

7. The light sensing device as recited in claim 6, wherein the first interconnect structure comprises:
   a plurality of metal pattern layers arranged from bottom to top to form a multi-layer structure; and
   a plurality of connection structures, each of the connection structures being located between two adjacent metal pattern layers of the metal pattern layers.

8. The light sensing device as recited in claim 6, wherein the semiconductor device layer is a polysilicon layer in a complementary metal oxide semiconductor device layer.

9. The light sensing device as recited in claim 6, wherein the first interconnect structure at least includes a dielectric material, a metal connection via, or a metal layer in a complementary metal oxide semiconductor device layer.

10. The light sensing device as recited in claim 6, wherein the light absorption layer at least includes a material layer characterized by electromagnetic propagation loss or includes a metal reflection layer and a material layer characterized by electromagnetic propagation loss.

11. The light sensing device as recited in claim 6, wherein the second interconnect structure at least includes a metal connection via and a metal layer in a complementary metal oxide semiconductor device layer.

12. A light sensing device comprising:
   a substrate having a recessed portion;
   a semiconductor device layer located directly above the recessed portion of the substrate, such that an airgap is between the semiconductor device layer and the substrate;
   a metal and insulation material stacked structure located on the semiconductor device layer, the metal and insulation material stacked structure comprising a first interconnect structure, a device conductive line, and a dielectric layer surrounding the first interconnect structure and encapsulating the device conductive line, wherein the dielectric layer serves as an etch blocking structure, such that a gap is between the first interconnect structure and the dielectric layer encapsulating the device conductive line; and
   a light absorption layer located on the first interconnect structure, wherein the first interconnect structure is located between the light absorption layer and the semiconductor device layer, such that the light absorption layer and the semiconductor device layer located at different levels are connected to each other and exchange heat.

13. The light sensing device as recited in claim 12, wherein the semiconductor device layer is a polysilicon layer in a complementary metal oxide semiconductor device layer.

14. The light sensing device as recited in claim 12, wherein the first interconnect structure at least includes a dielectric material, a metal connection via, or a metal layer in a complementary metal oxide semiconductor device layer.

15. The light sensing device as recited in claim 12, wherein the light absorption layer at least includes a material layer characterized by electromagnetic propagation loss or includes a metal reflection layer and a material layer characterized by electromagnetic propagation loss.

* * * * *